(12) United States Patent
Lee

(10) Patent No.: US 7,812,337 B2
(45) Date of Patent: Oct. 12, 2010

(54) NITRIDE SEMICONDUCTOR LIGHT EMITTING DEVICE AND FABRICATION METHOD THEREOF

(75) Inventor: Suk Hun Lee, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 553 days.

(21) Appl. No.: 11/661,148

(22) PCT Filed: Aug. 19, 2005

(86) PCT No.: PCT/KR2005/002755

§ 371 (c)(1),
(2), (4) Date: Feb. 26, 2007

(87) PCT Pub. No.: WO2006/022496

PCT Pub. Date: Mar. 2, 2006

(65) Prior Publication Data

US 2008/0087877 A1      Apr. 17, 2008

(30) Foreign Application Priority Data

Aug. 26, 2004   (KR) ...................... 10-2004-0067496

(51) Int. Cl.
*H01L 33/00* (2010.01)
(52) U.S. Cl. .......................................... 257/13; 257/94
(58) Field of Classification Search .................. 257/13, 257/84, 86, 110, 113, 120, 132, 142, 918, 257/E51.018, E51.019, E33.001, E33.008, 257/E33.01, E33.012, E33.013, E33.017, 257/E33.028, E33.03, E33.031, E33.032, 257/E33.033, E33.039, E33.04, E33.042, 257/E25.032; 438/22–47, 69, 493, 503, 507, 438/956
See application file for complete search history.

(56) References Cited

U.S. PATENT DOCUMENTS 5,990,500 A * 11/1999 Okazaki ...................... 257/99

(Continued)

FOREIGN PATENT DOCUMENTS

DE        199 55 747 A1     5/2001

(Continued)

OTHER PUBLICATIONS

Sakai S et al.: "Indium Silicon Co-doping in AlGaN/GaN multiple Quantum Wells", Proceedings of International Workshop on Nitride Semiconductors, Jan. 1, 2000, pp. 637-639, XP009133538 ISBN: 978-4-900526-13-6.

*Primary Examiner*—Wai-Sing Louie
*Assistant Examiner*—Sue Tang
(74) *Attorney, Agent, or Firm*—Birch, Stewart, Kolasch & Birch, LLP

(57) ABSTRACT

A nitride semiconductor light emitting device includes a first nitride semiconductor layer, a first Al-doped nitride semiconductor layer formed on the first semiconductor layer, an activation layer formed on the first Al-doped nitride semiconductor buffer layer, and a second nitride semiconductor layer formed on the activation layer. Another nitride semiconductor light emitting device includes a first nitride semiconductor layer, an activation layer formed on the first nitride semiconductor layer, a second Al-doped nitride semiconductor buffer layer formed on the activation layer, and a second nitride semiconductor layer formed on the second Al-doped nitride semiconductor buffer layer. Still another nitride semiconductor light emitting device includes a first semiconductor layer, a first Al-doped nitride semiconductor buffer layer formed on the first nitride semiconductor layer, an activation layer formed on the first Al-doped nitride semiconductor buffer layer, a second Al-doped nitride semiconductor buffer layer formed on the activation layer, and a second nitride semiconductor layer formed on the second Al-doped nitride semiconductor buffer layer.

44 Claims, 4 Drawing Sheets

U.S. PATENT DOCUMENTS

| | | |
|---|---|---|
| 6,172,382 B1 * | 1/2001 | Nagahama et al. ............ 257/94 |
| 6,204,084 B1 * | 3/2001 | Sugiura et al. ................ 438/46 |
| 6,849,881 B1 | 2/2005 | Harle et al. |
| 2001/0035531 A1 | 11/2001 | Kano et al. |
| 2004/0159851 A1 | 8/2004 | Edmond et al. |
| 2005/0139818 A1 * | 6/2005 | Lee et al. ...................... 257/14 |
| 2005/0230688 A1 | 10/2005 | Lee |

FOREIGN PATENT DOCUMENTS

| | | |
|---|---|---|
| GB | 2 344 461 A | 6/2000 |
| JP | 10-12923 A | 1/1998 |
| JP | 2000-196143 A | 7/2000 |
| JP | 2000-349337 A | 12/2000 |
| JP | 2002-33513 A | 1/2002 |
| KR | 2002-0037111 A | 5/2002 |
| WO | WO 2004/017431 A1 | 2/2004 |

* cited by examiner

[Fig. 1]
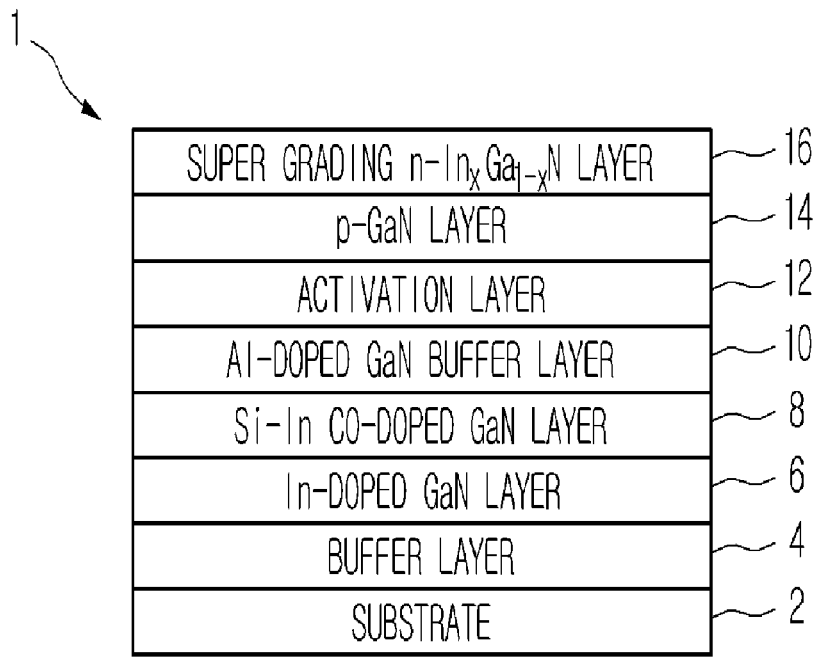
[Fig. 2]
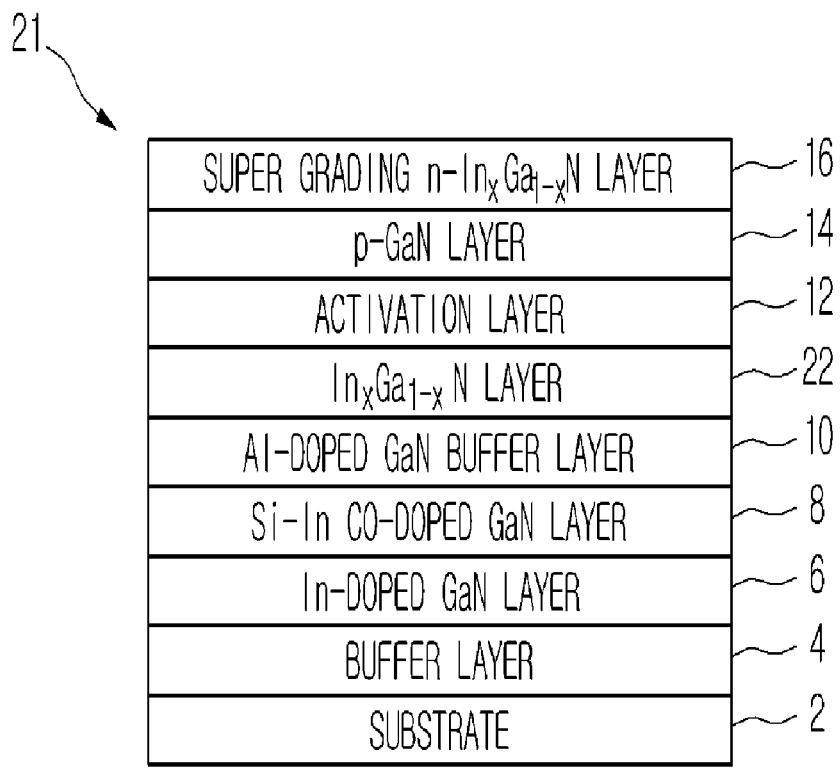

[Fig. 3]
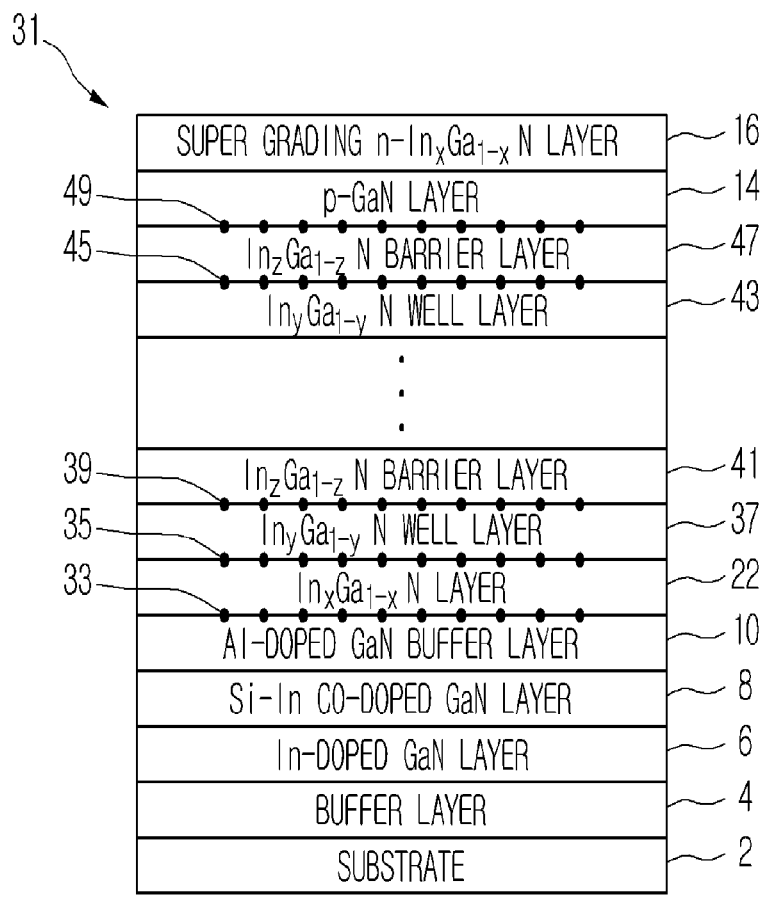
[Fig. 4]
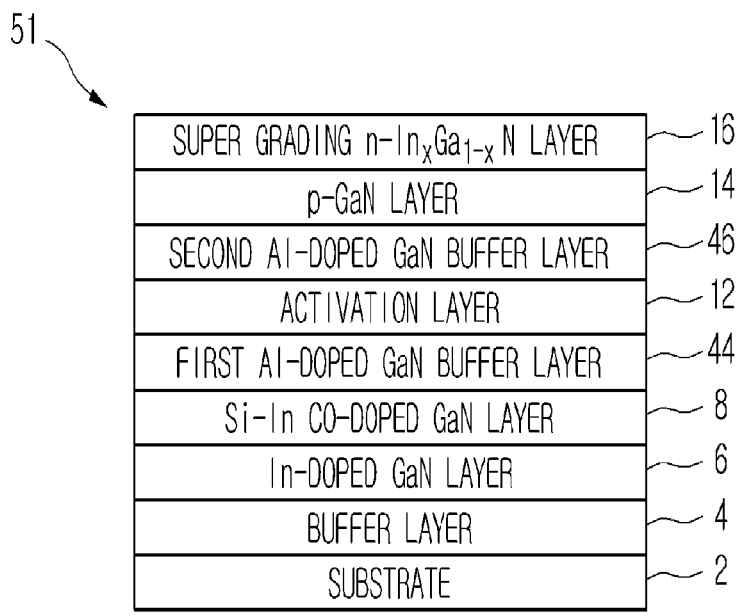

[Fig. 5]
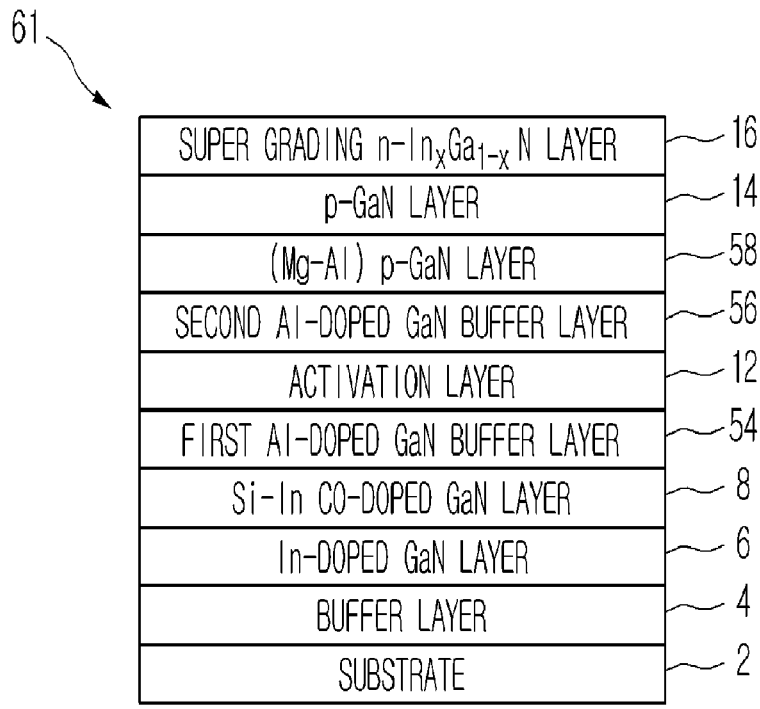
[Fig. 6]
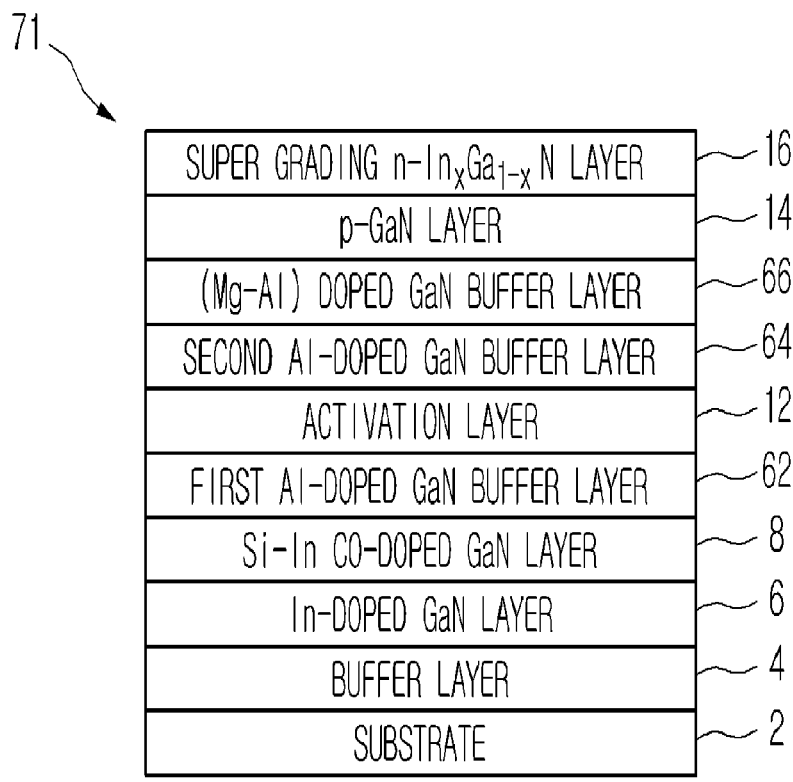

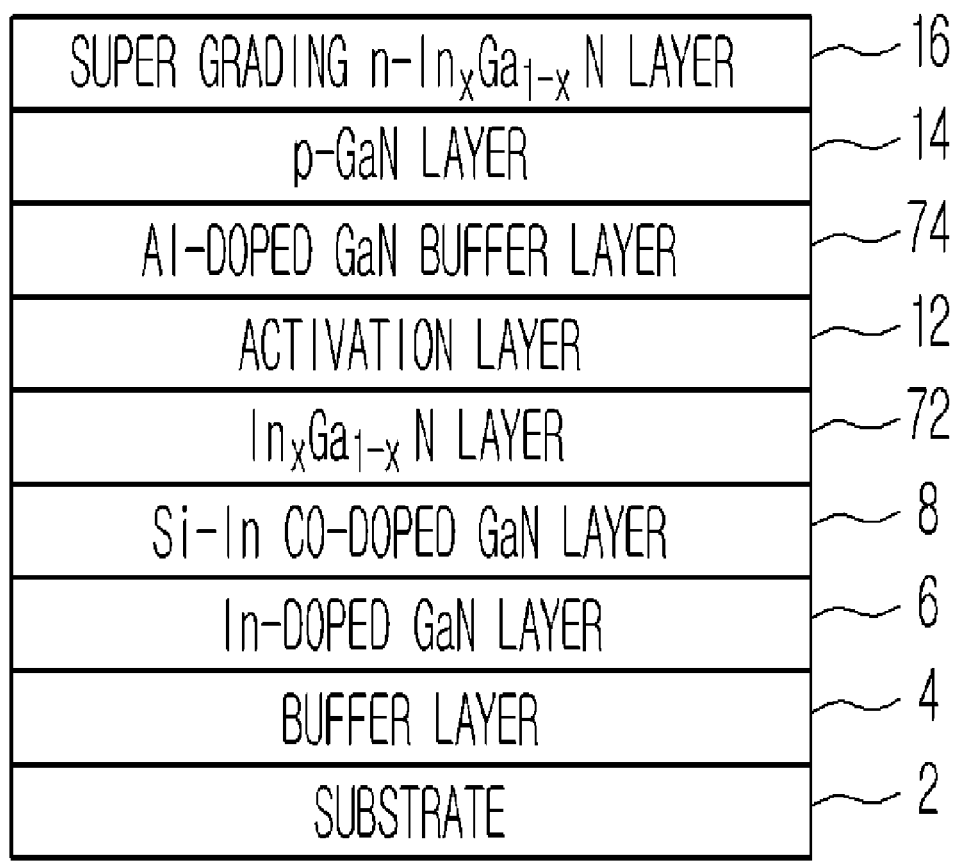
[Fig. 7]

NITRIDE SEMICONDUCTOR LIGHT EMITTING DEVICE AND FABRICATION METHOD THEREOF

TECHNICAL FIELD

The present invention relates to a nitride semiconductor light emitting device and a method of manufacturing the same.

BACKGROUND ART

In general, GaN based nitride semiconductor is applied to electronic devices that are high speed switching and high output devices such as blue and green light emitting diodes (LED), metal semiconductor field effect transistors (MES-FET), and high electron mobility transistors (HEMT). In particular, the blue and green LEDs have already been produced and the global sales of the blue and green LEDs have exponentially increased.

The GaN based nitride semiconductor light emitting device is grown on a sapphire substrate or a SiC substrate. Then, an $Al_YGa_{1-Y}N$ polycrystalline thin film is grown on the sapphire substrate or the SiC substrate as a buffer layer at a low growth temperature. Then, an undoped GaN layer, a Si-doped n-GaN layer, or a mixture of the above two structures is grown on the buffer layer at a high temperature to form an n-GaN layer as a first electrode layer. Also, a Mg-doped p-GaN layer is formed at upper layer as a second electrode layer to manufacture a nitride semiconductor light emitting device. An emission layer (a multiple quantum well structure activation layer) is interposed between the n-GaN layer and the p-GaN layer.

In general, in undoped GaN nitride semiconductor to which impurities are not added, yellow emission peak is shown over a very wide region in a 550 nm wavelength bandwidth, which is caused by the defects of vacancy of Ga atoms (VGa) in GaN nitride semiconductor crystal growth.

Among such defects, when the n-GaN nitride semiconductor that is the Si-doped first electrode layer is grown, VGa is reduced so that very strong bandedge emission is shown. When the GaN nitride semiconductor is doped with silicon, VGa is exchanged by silicon. However, the dangling bond of N atoms continuously exists to affect the reliability of the light emitting device.

Also, the p-GaN layer that is the second electrode layer is formed by doping Mg atoms during the growth of crystal. The position of Ga is exchanged by Mg atoms implanted as a doping source during the growth of crystal to form the p-GaN layer. The Mg atoms are combined with a hydrogen gas separated from a carrier gas and a source to form Mg—H compound in the GaN crystal layer so that a high resistance body of about 10MΩ is obtained.

Therefore, after forming a pn conjunction light emitting device, a subsequent activation process of cutting off the Mg—H compound to exchanging the Mg atoms into the position of Ga is required. However, the amount of the light emitting device that operates as a carrier that contributes to emission in the activation process is $10^{17}/cm^3$, which is much lower than Mg atomic concentration of no less than $10^{19}/cm^3$ so that it is very difficult to form resistant contact.

Also, the Mg atoms that remain in p-GaN nitride semiconductor without being activated to a carrier operate as a center that traps the light emitted from an interface to rapidly reduce optical output.

In order to solve the problem, very thin transmissive resistant metal is used to reduce contact resistance so that current implantation efficiency is improved. In general, the optical transmittance of the thin transmissive resistant metal used in order to reduce the contact resistance is about 75 to 80% and the other operates as loss. Also, it has limitations on improving the optical output of the light emitting device during the growth of the crystal of the nitride semiconductor without improving the design of the light emitting device and the crystal properties of the emission layer and the p-GaN layer in order to improve internal quantum efficiency.

DISCLOSURE OF INVENTION

Technical Problem

It is an object of the present invention to provide a nitride semiconductor light emitting device capable of improving the crystal property of the activation layer that forms the nitride semiconductor light emitting device and of improving optical output and reliability and a method of manufacturing the same.

Technical Solution

In order to achieve the above object, there is provided a nitride semiconductor light emitting device comprising a first nitride semiconductor layer, a first Al-doped nitride semiconductor buffer layer formed on the first nitride semiconductor layer, an activation layer formed on the first Al-doped nitride semiconductor buffer layer, and a second nitride semiconductor layer formed on the activation layer.

In order to achieve the above object, according to another embodiment, there is provided a nitride semiconductor light emitting device comprising a first nitride semiconductor layer, an activation layer formed on the first nitride semiconductor layer, a second Al-doped nitride semiconductor buffer layer formed on the activation layer, and a second nitride semiconductor layer formed on the second Al-doped nitride semiconductor buffer layer.

Also, in order to achieve the above object, according to still another embodiment, there is provided a nitride semiconductor light emitting device comprising a first nitride semiconductor layer, a first Al-doped nitride semiconductor buffer layer formed on the first nitride semiconductor layer, an activation layer formed on the first Al-doped nitride semiconductor buffer layer, a second Al-doped nitride semiconductor buffer layer formed on the activation layer, and a second nitride semiconductor layer formed on the second Al-doped nitride semiconductor buffer layer.

Also, in order to achieve the above object, a method of manufacturing a nitride semiconductor light emitting device according to an embodiment of the present invention comprising: forming a buffer layer on a substrate, forming an In-doped GaN layer on the buffer layer, forming a first electrode layer on the In-doped GaN layer, forming a first Al-doped GaN buffer layer on the first electrode layer, forming an activation layer that emits light on the first Al-doped GaN buffer layer, forming a p-GaN layer on the activation layer, and forming a second electrode layer on the p-GaN layer.

A method of manufacturing a nitride semiconductor light emitting device according to another embodiment of the present invention comprising: forming a buffer layer on a substrate, forming an In-doped GaN layer on the buffer layer, forming a first electrode layer on the In-doped GaN layer, forming an activation layer that emits light on the first electrode layer, forming a second Al-doped GaN buffer layer on the activation layer, forming a p-GaN layer on the second Al-doped GaN buffer layer, and forming a second electrode layer on the p-GaN layer.

A method of manufacturing a nitride semiconductor light emitting device according to still another embodiment of the present invention comprising: forming a buffer layer on a substrate, forming an In-doped GaN layer on the buffer layer, forming a first electrode layer on the In-doped GaN layer, forming a first Al-doped GaN buffer layer on the first electrode layer, forming an activation layer that emits light on the first Al-doped GaN buffer layer, forming a second Al-doped GaN buffer layer on the activation layer, forming a p-GaN layer on the second Al-doped GaN buffer layer, and forming a second electrode layer on the p-GaN layer.

Advantageous Effects

According to the nitride semiconductor light emitting device of the present invention and the method of manufacturing the same, it is possible to improve the crystal property of the activation layer that forms the nitride semiconductor light emitting device and to improve the optical output and the reliability of the light emitting device.

BRIEF DESCRIPTION OF THE DRAWINGS

FIG. 1 schematically illustrates the stacked structure of a nitride semiconductor light emitting device according to a first embodiment of the present invention.

FIG. 2 schematically illustrates the stacked structure of a nitride semiconductor light emitting device according to a second embodiment of the present invention.

FIG. 3 schematically illustrates the stacked structure of a nitride semiconductor light emitting device according to a third embodiment of the present invention.

FIG. 4 schematically illustrates the stacked structure of a nitride semiconductor light emitting device according to a fourth embodiment of the present invention.

FIG. 5 schematically illustrates the stacked structure of a nitride semiconductor light emitting device according to a fifth embodiment of the present invention.

FIG. 6 schematically illustrates the stacked structure of a nitride semiconductor light emitting device according to a sixth embodiment of the present invention.

FIG. 7 schematically illustrates the stacked structure of a nitride semiconductor light emitting device according to a seventh embodiment of the present invention.

MODE FOR THE INVENTION

Embodiments of the present invention will be described in detail with reference to the attached drawings.

FIG. 1 schematically illustrates the stacked structure of a nitride semiconductor light emitting device according to a first embodiment of the present invention.

As illustrated in FIG. 1, in the nitride semiconductor light emitting device 1 according to the present invention, a buffer layer 4 is formed on a substrate 2. Here, the buffer layer 4 may have a structure selected from the group consisting of an AlInN/GaN stacked structure, an InGaN/GaN super lattice structure, an $In_xGa_{1-x}N$/GaN stacked structure, and an $Al_xIn_yGa_{1-(x+y)}N$/$In_xGa_{1-x}N$/GaN stacked structure ($0 \leq x \leq 1$, $0 \leq y \leq 1$, $x+y \leq 1$).

An In-doped GaN layer 6 is formed on the buffer layer 4 and an n-type first electrode layer is formed on the In-doped GaN layer 6. Here, Si—In co-doped GaN layer 8 may be used as the n-type first electrode layer.

Also, an Al-doped GaN buffer layer 10 is formed on the Si—In co-doped GaN layer 8 and an activation layer 12 that emits light is formed on the Al-doped GaN buffer layer 10.

The activation layer 12 has a single quantum well structure or a multiple quantum well structure. An example of the stacked structure of the activation layer 12 will be described in detail with reference to FIG. 3. According to the activation layer 12 of the present invention, it is possible to obtain enough optical efficiency even when the activation layer 12 has the single quantum well structure.

According to the present invention, the Al-doped GaN buffer layer 10 may be formed by doping a small amount of GaAl atoms during the growth of the GaN nitride semiconductor after growing the Si—In co-doped GaN layer 8 used as the first electrode layer. The Al-doped GaN buffer layer 10 realizes a strong Al—N bond with N atoms that remain due to the dangling bond caused by the vacancy of Ga atoms to improve the state of an interface. Therefore, it is possible to minimize the crystal defect transited to the activation layer 12.

Then, a p-GaN layer 14 is formed on the activation layer 12. At this time, the p-GaN layer 14 may be doped with Mg. Also, the p-GaN layer 14 may be Mg—Al co-doped.

An n-type second electrode layer is formed on the p-GaN layer 14. Here, a super grading n-$In_xGa_{1-x}N$ layer 16 whose energy band gap is controlled by sequentially changing Indium composition may be used as the n-type second electrode layer. At this time, the composition range of the super grading n-$In_xGa_{1-x}N$ layer 16 may be $0<x<0.2$. The super grading n-$In_xGa_{1-x}N$ layer 16 may be doped with silicon.

As described above, the nitride semiconductor light emitting device according to the present invention has an npn junction light emitting device structure unlike the related art pn junction light emitting device considering that the first electrode layer 8 and the second electrode layer 16 are formed of the n-type nitride semiconductor and the p-GaN layer 14 is interposed between the first electrode layer 8 and the second electrode layer 16.

Also, since the resistance of the n-type nitride semiconductor (for example, the super grading n-$In_xGa_{1-x}N$ layer 16) used as the second electrode layer is lower than the resistance of the related art p-GaN contact layer, it is possible to reduce contact resistance to maximize the implantation of current. A transmissive resistant or transmissive oxide layer capable of maximizing current spreading and having excellent optical transmittance may be used as a transparent electrode that applies a bias voltage to the second electrode in order to maximize optical output. ITO, ZnO, RuOx, IrOx, NiO, or Au alloy metal including Ni may be used as such a material.

Here, although not shown, an InGaN/AlInGaN super lattice structure layer or an InGaN/InGaN super lattice structure layer may be used as the second electrode layer. The InGaN/AlInGaN super lattice structure layer or the InGaN/InGaN super lattice structure layer may be doped with silicon.

On the other hand, the following specimen was manufactured and the characteristics thereof were examined in order to testify the electrical/optical characteristics and effect of the Al-doped GaN nitride semiconductor.

According to the present invention, a specimen having a two dimensional electron gas (2DEG) structure composed of an AlGaN/undoped GaN/SI(semi-insulating) GaN/buffer/sapphire substrate and an AlGaN/Al-doped GaN/SI(semi-insulating) GaN/buffer/sapphire substrate was manufactured and the electrical/optical characteristics of the specimen were measured.

First, in the electrical characteristic examined by Hall measurement, the carrier mobility of the structure to which an undoped GaN layer is applied was 1,130 and 3,390 $cm^2$/Vsec at a room temperature and at a low temperature of 77K. The carrier mobility of the structure to which an Al-doped GaN layer is applied was 1,500 and 4,870 cm$^2$/Vsec at the room temperature and at the low temperature of 77K. Therefore, it is noted that the structure to which the Al-doped GaN layer is applied has excellent characteristic. At this time, the sheet concentration was 1 to 1.2 e$^{13}$/cm$^2$ at the room temperature and at the low temperature of 77K.

The reason why the carrier mobility increases without increase in the sheet concentration is because the vacancy of the Ga atoms of the undoped GaN nitride semiconductor is exchanged by Al atoms so that the Al atoms are combined with the N atoms that remain due to the dangling bond to form an Al—N bond that is stronger than a Ga—N bond and to thus reduce crystal defects.

Also, in 10K PL measurement for testifying the optical characteristic, stronger bandedge emission by no less than 7 times was observed in the structure to which the Al-doped GaN layer is applied than in the structure to which undoped GaN layer is applied.

Such a result coincides with the result of testifying the electrical characteristic so that the excellent electrical/optical characteristics of the Al-doped GaN buffer nitride semiconductor are testified. The crystal defect or point defect generated by the first electrode layer to be transited to the emission layer is effectively suppressed to maximize the quantum efficiency of the light emitting device.

On the other hand, FIG. 2 schematically illustrates the stacked structure of a nitride semiconductor light emitting device according to a second embodiment of the present invention. In the stacked structure illustrated in FIG. 2, description of the layer (denoted by the same reference numeral) described with reference to FIG. 1 will be omitted.

A nitride semiconductor light emitting device 21 according to the second embodiment of the present invention is different from the nitride semiconductor light emitting device 1 according to the first embodiment illustrated in FIG. 1 in that an InxGa1–xN layer 22 containing a small amount of Indium is further included.

That is, according to the nitride semiconductor light emitting device 21 according to the second embodiment of the present invention, the InxGa1–xN layer 22 containing a small amount of Indium is further formed between the Al-doped GaN buffer layer 10 and the activation layer 12. In order to improve internal quantum efficiency, the InxGa1–xN layer 22 containing a small amount of Indium is additionally grown before growing the activation layer 12 to control the strain of the activation layer 12.

Then, the structure of the activation layer applied to a nitride semiconductor light emitting device 31 according to the present invention will be described in detail with reference to FIG. 3. FIG. 3 schematically illustrates the stacked structure of a nitride semiconductor light emitting device according to a third embodiment of the present invention. In the stacked structure illustrated in FIG. 3, description of the layer (denoted by the same reference numeral) described with reference to FIG. 1 will be omitted.

In a nitride semiconductor light emitting device 31 according to the third embodiment of the present invention, as illustrated in FIG. 3, in order to increase the internal quantum efficiency, the low-mole InxGa1–xN layer 22 containing a small amount of Indium that controls the strain of the activation layer is formed. Also, in order to improve optical output and reverse leakage current caused by fluctuation in Indium, SiNx cluster layers 33 and 35 controlled in the form of an atomic scale are further formed under and on the low-mole InxGa1–xN layer 22.

Also, the activation layer that emits light may has a single quantum well structure or a multiple quantum well structure formed of InyGa1–yN well layers/InzGa1–zN barrier layers.

In FIG. 3, a light emitting device in which the activation layer has the multiple quantum well structure that further comprises SiNx cluster layers 39 and 45 between InyGa1–yN well layers 37 and 43 and InzGa1–zN barrier layers 41 and 47 is illustrated. Here, in order to improve the emission efficiency of the activation layer, the composition ratio may be controlled to be the InyGa1–yN well layers (0<y<0.35)/the SiNx cluster layers/the InzGa1–zN barrier layers (0<z<0.1). Considering the relationship between the activation layer and the low-mole InxGa1–xN layer 22 containing a small amount of Indium, the amount of Indium with which the InyGa1–yN well layers 37 and 43/the InzGa1–zN barrier layers 41 and 47 are doped and the amount of Indium with which the low-mole InxGa1–xN layer 22 is doped may be controlled to have the values of 0<x<0.1, 0<y<0.35, and 0<z<0.1.

Also, although not shown in the drawings, a GaN cap layer for controlling fluctuation in the amount of Indium of the InyGa1–yN well layers may be formed between the InyGa1–yN well layers and the InzGa1–zN barrier layers that form the activation layer. At this time, the amounts of Indium of the well layers and the barrier layers that emit light may be formed to be InyGa1–yN (0<y<0.35)/GaN cap/InzGa1–zN (0<z<0.1).

After growing the last layer of the activation layer having the single quantum well structure or the multiple quantum well structure, the SiNx cluster layer 49 is grown to the thickness of the atomic scale so that it is possible to prevent the Mg atoms of the p-GaN layer 14 from diffusing into the inside of the activation layer.

On the other hand, FIG. 4 schematically illustrates the stacked structure of a nitride semiconductor light emitting device according to a fourth embodiment of the present invention. In the stacked structure illustrated in FIG. 4, description of the layer (denoted by the same reference numeral) described with reference to FIG. 1 will be omitted.

A nitride semiconductor light emitting device 51 according to the fourth embodiment of the present invention is different from the nitride semiconductor light emitting device 1 according to the first embodiment illustrated in FIG. 1 in that a first Al-doped GaN buffer layer 44 is formed under the activation layer 12 and that a second Al-doped GaN buffer layer 46 is formed on the activation layer 12.

According to the fourth embodiment of the present invention, the first Al-doped GaN buffer layer 44 may be formed by doping a small amount of GaAl atoms during the growth of the GaN nitride semiconductor after growing the Si—In co-doped GaN layer 8 used as the first electrode layer. The first Al-doped GaN buffer layer 44 realizes a strong Al—N bond with the N atoms that remain due to the dangling bond caused by the vacancy of the Ga atoms to improve the state of an interface. Therefore, it is possible to minimize the crystal defect transited to the activation layer 12.

Also, before growing the p-GaN layer 14, the second Al-doped GaN buffer layer 46 is grown again between the activation layer 12 and the p-GaN layer 14 so that it is possible to fill the vacancy of the Ga atoms and to prevent the Mg atoms from being diffused into the inside of the activation layer 12 during the growth of the p-GaN layer 14. Therefore, it is possible to improve the interface characteristic and to improve the internal quantum efficiency of the activation layer 12 to maximize the optical output of the light emitting device.

FIG. 5 schematically illustrates the stacked structure of a nitride semiconductor light emitting device according to a fifth embodiment of the present invention. In the stacked structure illustrated in FIG. 5, description of the layer (denoted by the same reference numeral) described with reference to FIG. 1 will be omitted.

A nitride semiconductor light emitting device 61 according to the fifth embodiment of the present invention is different from the nitride semiconductor light emitting device 1 according to the first embodiment illustrated in FIG. 1 in that a first Al-doped GaN buffer layer 54 is formed under the activation layer 12, that a second Al-doped GaN buffer layer 56 is formed on the activation layer 12, and that an (Mg—Al) p-GaN layer 58 is further formed between the second Al-doped GaN buffer layer 56 and the p-GaN layer 14. The nitride semiconductor light emitting device 61 is formed to have such a stacked structure so that it is possible to improve the interface characteristic of the activation layer 12 and to increase the optical output.

FIG. 6 schematically illustrates the stacked structure of a nitride semiconductor light emitting device according to a sixth embodiment of the present invention. In the stacked structure illustrated in FIG. 6, description of the layer (denoted by the same reference numeral) described with reference to FIG. 1 will be omitted.

A nitride semiconductor light emitting device 71 according to the sixth embodiment of the present invention is different from the nitride semiconductor light emitting device 1 according to the first embodiment illustrated in FIG. 1 in that a first Al-doped GaN buffer layer 62 is formed under the activation layer 12, that a second Al-doped GaN buffer layer 64 is formed on the activation layer 12, and that an (Mg—Al) doped GaN buffer layer 66 is further formed between the second Al-doped GaN buffer layer 64 and the p-GaN layer 14. The nitride semiconductor light emitting device 71 having such a stacked structure is formed so that it is possible to improve the interface characteristic of the activation layer 12 and to increase the optical output.

FIG. 7 schematically illustrates the stacked structure of a nitride semiconductor light emitting device according to a seventh embodiment of the present invention. In the stacked structure illustrated in FIG. 7, description of the layer (denoted by the same reference numeral) described with reference to FIG. 1 will be omitted.

A nitride semiconductor light emitting device 81 according to the seventh embodiment of the present invention is different from the nitride semiconductor light emitting device 1 according to the first embodiment illustrated in FIG. 1 in that an InxGa1-xN layer 72 containing a small amount of Indium is formed under the activation layer 12 and that an Al-doped GaN buffer layer 74 is formed on the activation layer 12.

That is, in the nitride semiconductor light emitting device 81 according to the seventh embodiment of the present invention, the InxGa1-xN layer 72 containing a small amount of Indium is further formed between the Si—In co-doped GaN layer 8 that is the first electrode layer and the activation layer 12. In order to increase the internal quantum efficiency, before growing the activation layer 12, the InxGa1-xN layer 72 containing a small amount of Indium is further grown to control the strain of the activation layer 12.

Also, before growing the p-GaN layer 14, the Al-doped GaN buffer layer 74 is grown between the activation layer 12 and the p-GaN layer 14 so that it is possible to prevent the Mg atoms from being diffused into the inside of the activation layer 12 during the growth of the p-GaN layer 14. Therefore, it is possible to improve the interface characteristic and the internal quantum efficiency of the activation layer 12 and to thus maximize the optical output of the light emitting device.

INDUSTRIAL APPLICABILITY

According to the nitride semiconductor light emitting device of the present invention and the method of manufacturing the same, it is possible to improve the crystal property of the activation layer that forms the nitride semiconductor light emitting device and to improve the optical output and the reliability of the light emitting device.

The invention claimed is:

1. A semiconductor light emitting device comprising:
   a first semiconductor layer;
   an active layer formed on the first semiconductor layer;
   a second semiconductor layer formed on the active layer; and
   a first nitride based semiconductor layer including Al and formed between the first semiconductor layer and the active layer and/or a second based semiconductor layer including Al and formed between the active layer and the second semiconductor layer,
   wherein at least one $SiN_X$ cluster layer is formed between the first nitride based semiconductor layer including Al and the second semiconductor layer.

2. The semiconductor light emitting device as claimed in claim 1, further comprising under the first semiconductor layer:
   a substrate; and
   a buffer layer formed on the substrate.

3. The semiconductor light emitting device as claimed in claim 2, wherein the layer is formed of one selected from the group consisting of an AlInN/GaN stacked structure, an InGaN/GaN super lattice structure, an $In_xGa_{1-x}N/GaN$ stacked structure, and an $Al_xIn_yGa_{1-(x+y)}N/In_xGa_{1-x}N/GaN$ stacked structure.

4. The semiconductor light emitting device as claimed in claim 1, wherein the first semiconductor layer comprises:
   an In-doped or In-undoped GaN layer; and
   a first electrode layer formed on the GaN layer.

5. The semiconductor light emitting device as claimed in claim 4, wherein the first electrode layer is Si—In co-doped GaN layer.

6. The semiconductor light emitting device as claimed in claim 1, further comprising:
   an $In_xGa_{1-x}N$ layer formed between the first based semiconductor layer and the active layer.

7. The semiconductor light emitting device as claimed in claim 6, wherein an amount of Indium with which the $In_yGa_{1-y}N$ well layers/the $In_zGa_{1-z}N$ barrier layers that form the active layer are doped and an amount of Indium with which the $In_xGa_{1-x}N$ layer is doped is controlled to have values of $0<x<0.1$, $0<y<0.35$, and $0<z<0.1$.

8. The semiconductor light emitting device as claimed in claim 1, wherein the at least one $SiN_X$ cluster layer is formed to have a thickness of an atomic scale.

9. The semiconductor light emitting device as claimed in claim 1, wherein the active layer has a single quantum well structure or a multiple quantum well structure formed of $In_yGa_{1-y}N$ well layers/$In_zGa_{1-z}N$ barrier layers.

10. The semiconductor light emitting device as claimed in claim 9, further comprising:

a GaN cap layer formed between the $In_yGa_{1-y}N$ well layers and the $In_zGa_{1-z}N$ barrier layers that form the active layer.

11. The semiconductor light emitting device as claimed in claim 1, wherein the second semiconductor layer comprises a GaN layer containing Mg and Al.

12. The semiconductor light emitting device as claimed in claim 1, further comprising:
a third semiconductor layer formed on the second semiconductor layer.

13. The semiconductor light emitting device as claimed in claim 12, wherein the third semiconductor layer has a super grading structure in which an amount of Indium sequentially changes or a super lattice structure in which In or Al is contained.

14. The semiconductor light emitting device as claimed in claim 13, wherein the third semiconductor layer of the super grading structure is n-$In_xGa_{1-x}N$ layer (0<x<0.2).

15. The semiconductor light emitting device as claimed in claim 12, wherein the third semiconductor layer has an InGaN/InGaN super lattice structure or an InGaN/AlInGaN super lattice structure.

16. The semiconductor light emitting device as claimed in claim 12, wherein the third semiconductor layer is doped with silicon.

17. The semiconductor light emitting device as claimed in claim 12, further comprising:
a transparent electrode formed on the third semiconductor layer.

18. The semiconductor light emitting device as claimed in claim 17, wherein the transparent electrode is formed of transmissive oxide or transmissive resistant material.

19. The semiconductor light emitting device as claimed in claim 17, wherein the transparent electrode is formed of one selected among the group consisting of ITO, ZnO, IrOx, RuOx, NiO, and Au alloy including Ni.

20. The semiconductor light emitting device as claimed in claim 1, further comprising:
a transparent electrode formed on the second semiconductor layer.

21. The semiconductor light emitting device as claimed in claim 17, wherein the transparent electrode is formed of transmissive oxide or transmissive resistant material.

22. The semiconductor light emitting device as claimed in claim 20, wherein the transparent electrode is formed of one selected among the group consisting of ITO, ZnO, IrOx, RuOx, NiO, and Au alloy including Ni.

23. The semiconductor light emitting device as claimed in claim 1, further comprising:
an (Mg—Al) doped third based semiconductor layer formed on the second nitride based semiconductor layer.

24. The semiconductor light emitting device as claimed in claim 23, further comprising:
a third semiconductor layer formed on the second semiconductor layer.

25. The semiconductor light emitting device as claimed in claim 24, wherein the third semiconductor layer has a super grading structure in which an amount of Indium sequentially changes or a super lattice structure in which In or Al is contained.

26. The semiconductor light emitting device as claimed in claim 25, wherein the third semiconductor layer of the super grading structure is n-$In_xGa_{1-x}N$ layer (0<x<0.2).

27. The semiconductor light emitting device as claimed in claim 24, wherein the third semiconductor layer of the super lattice structure has an InGaN/InGaN super lattice structure or an InGaN/AlInGaN super lattice structure.

28. The semiconductor light emitting device as claimed in claim 24, wherein the third semiconductor layer is doped with silicon.

29. The semiconductor light emitting device as claimed in claim 24, further comprising:
a transparent electrode formed on the third semiconductor layer.

30. The semiconductor light emitting device as claimed in claim 23, further comprising:
a transparent electrode formed on the second semiconductor layer.

31. The semiconductor light emitting device as claimed in claim 1, further comprising:
an $In_xGa_{1-x}N$ layer formed between the first semiconductor layer and the active layer.

32. The semiconductor light emitting device as claimed in claim 31, wherein an amount of Indium with which the $In_yGa_{1-y}N$ well layers/the $In_zGa_{1-z}N$ barrier layers that form the active layer are doped and the amount of Indium with which the $In_xGa_{1-x}N$ layer is doped are controlled to have values of 0<x<0.1, 0<y<0.35, and 0<z<0.1.

33. The semiconductor light emitting device as claimed in claim 1, wherein the first based semiconductor layer including Al is formed directly below the active layer and between the first semiconductor layer and the active layer and/or the second based semiconductor layer including Al is formed directly on the active layer and between the active layer and the second semiconductor layer.

34. The semiconductor light emitting device as claimed in claim 1, wherein the first based semiconductor layer including Al is an Al-doped first nitride based semiconductor layer.

35. The semiconductor light emitting device as claimed in claim 1, wherein the second based semiconductor layer including Al is an Al-doped second nitride based semiconductor layer.

36. A semiconductor light emitting device comprising:
a substrate;
a buffer layer formed on the substrate;
a first GaN based layer including In, formed on the buffer layer;
a second GaN layer including Si or In, formed on the first GaN based layer;
an active layer formed on the GaN layer;
a p-GaN layer formed on the active layer; and
a first nitride based semiconductor layer including Al and formed between the GaN layer and the active layer and/or a second nitride based semiconductor layer including Al and formed between the active layer and the p-GaN layer,
wherein at least one $SiN_x$ cluster layer is formed between the first GaN layer and the p-GaN layer.

37. The semiconductor light emitting device as claimed in claim 36, further comprising:
an (Mg—Al) doped nitride based semiconductor layer formed on the second nitride based semiconductor layer.

38. The semiconductor light emitting device as claimed in claim 36, comprising an n-type semiconductor layer formed on the p-GaN layer, wherein the n-type semiconductor layer is formed of one selected among the group consisting of an n-$In_xGa_{1-x}N$ layer of a super grading structure in which an amount of Indium sequentially changes, an InGaN/InGaN super lattice structure, and an InGaN/AlInGaN super lattice structure.

39. The semiconductor light emitting device as claimed in claim 36, further comprising:
  an $In_xGa_{1-x}N$ layer formed under the active layer.

40. The semiconductor light emitting device as claimed in claim 36, further comprising:
  an (Mg—Al) p-GaN layer formed under the p-GaN layer.

41. The semiconductor light emitting device as claimed in claim 36, further comprising:
  a GaN cap layer formed between the $In_yGa_{1-y}N$ well layers and the $In_zGa_{1-z}N$ barrier layers that form the active layer.

42. The semiconductor light emitting device as claimed in claim 36, wherein the first nitride based semiconductor layer including Al is formed directly below the active layer and between the GaN layer and the active layer and/or the second nitride based semiconductor layer is formed directly on the active layer and between the active layer and the p-GaN layer.

43. The semiconductor light emitting device as claimed in claim 36, wherein the first based semiconductor layer including Al is an Al-doped first nitride based semiconductor layer.

44. The semiconductor light emitting device as claimed in claim 36, wherein the Al in the second based semiconductor layer including Al is an Al-doped second nitridebased semiconductor layer.

* * * * *